(12) United States Patent
Maeda et al.

(10) Patent No.: US 9,018,736 B2
(45) Date of Patent: Apr. 28, 2015

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Kazuhiro Maeda, Tokyo (JP); Toshihiko Shiga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/162,865

(22) Filed: Jan. 24, 2014

(65) Prior Publication Data
US 2014/0319513 A1 Oct. 30, 2014

(30) Foreign Application Priority Data

Apr. 24, 2013 (JP) .................................. 2013-091548

(51) Int. Cl.
| | |
|---|---|
| *H01L 29/20* | (2006.01) |
| *H01L 21/3205* | (2006.01) |
| *H01L 29/04* | (2006.01) |
| *H01L 21/283* | (2006.01) |

(Continued)

(52) U.S. Cl.
CPC ............ *H01L 29/045* (2013.01); *H01L 21/283* (2013.01); *H01L 29/1608* (2013.01); *H01L 29/2003* (2013.01); *H01L 29/22* (2013.01)

(58) Field of Classification Search
CPC ..... H01L 21/283; H01L 29/22; H01L 29/045; H01L 29/1608; H01L 29/2003
USPC .............................. 257/77, 615; 438/604, 706
See application file for complete search history.

(56) References Cited

U.S. PATENT DOCUMENTS

| | | | |
|---|---|---|---|
| 6,894,391 B1 | 5/2005 | Takatani | |
| 7,786,503 B2 * | 8/2010 | D'Evelyn et al. ............. | 257/103 |

(Continued)

FOREIGN PATENT DOCUMENTS

| | | |
|---|---|---|
| JP | 61-156785 A | 7/1986 |
| JP | 61-156786 A | 7/1986 |
| JP | 8-264886 A | 10/1996 |

(Continued)

OTHER PUBLICATIONS

Maeda et al.; "Effect of underlying metal on gold plating line fabricated on GaN", *The 74th JSAP Autumn Meeting*, (2013).

Davydov et al.; "Combinatorial investigation of structural quality of Au/Ni contacts on GaN", *Applied Surface Science* 223, pp. 24-29, (2004).

*Primary Examiner* — Nicholas Tobergte
(74) *Attorney, Agent, or Firm* — Leydig, Voit & Mayer, Ltd.

(57) ABSTRACT

A semiconductor device includes a substrate having a hexagonal crystalline structure and a (0001) surface, and conductive films on the surface of the substrate. The conductive films include a first conductive film and a second conductive film located above the first conductive film with respect to the surface, wherein the first conductive film has a crystalline structure which does not have a plane that has a symmetry equivalent to the symmetry of atomic arrangement in the surface of the substrate, the second conductive film has a crystalline structure having at least one plane that has a symmetry equivalent to the symmetry of atomic arrangement in the surface of the substrate, and the second conductive film is polycrystalline and has a grain size no larger than 15 μm.

9 Claims, 12 Drawing Sheets

(51) Int. Cl.
*H01L 29/16* (2006.01)
*H01L 29/22* (2006.01)

(56) References Cited

U.S. PATENT DOCUMENTS

2003/0012874 A1* 1/2003 Lange et al. .................. 427/240

2003/0207125 A1* 11/2003 Sunakawa et al. ............ 428/428

FOREIGN PATENT DOCUMENTS

| JP | 11-54843 A | 2/1999 |
| JP | 2001-15852 A | 1/2001 |
| JP | 2005-191380 A | 7/2005 |

* cited by examiner

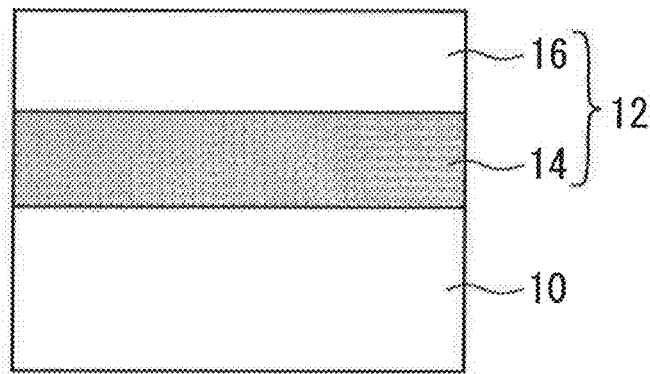
F I G. 1
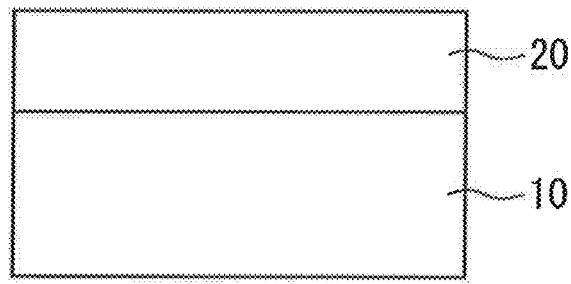
F I G. 2
Comparative example

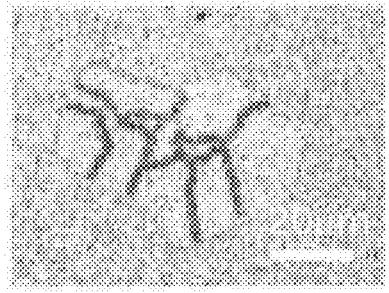 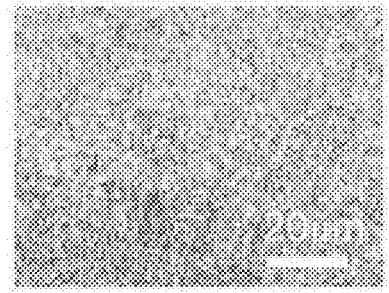
FIG. 3A            FIG. 3B
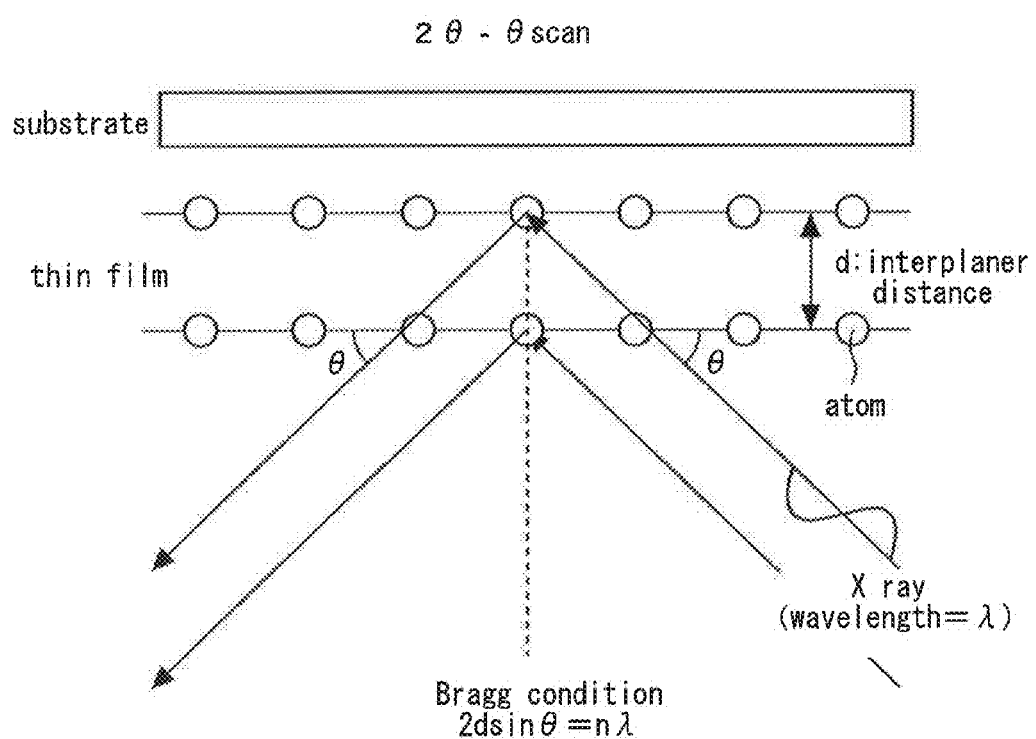
FIG. 4

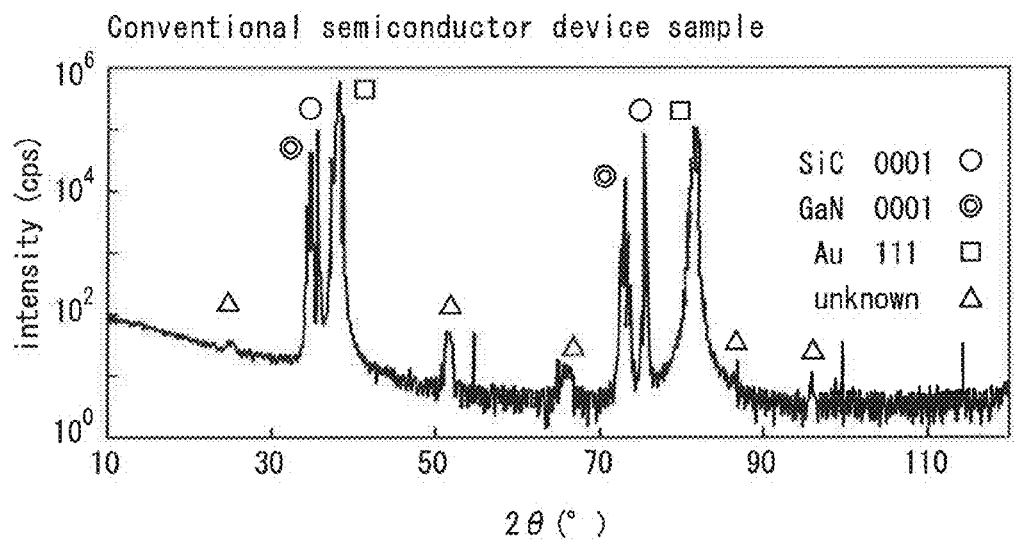
F I G. 5A
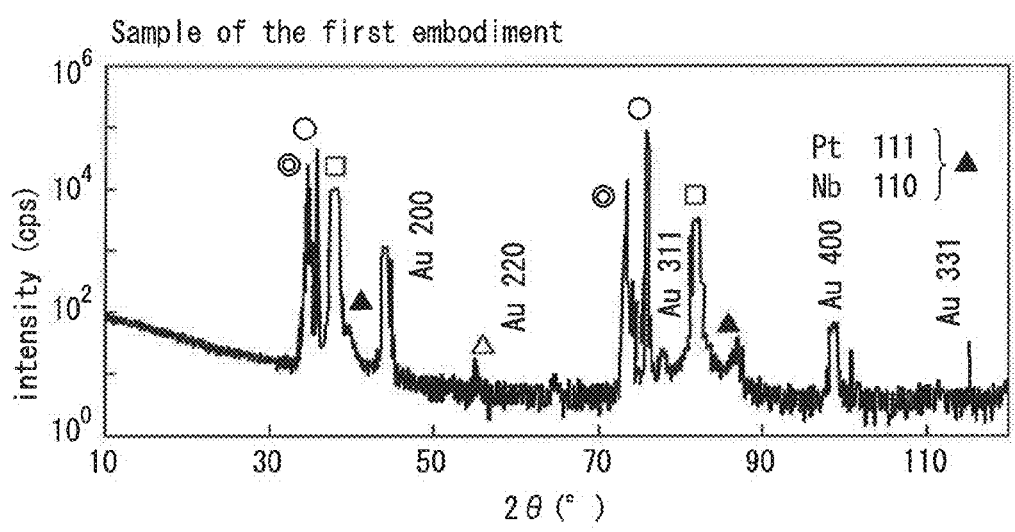
F I G. 5B

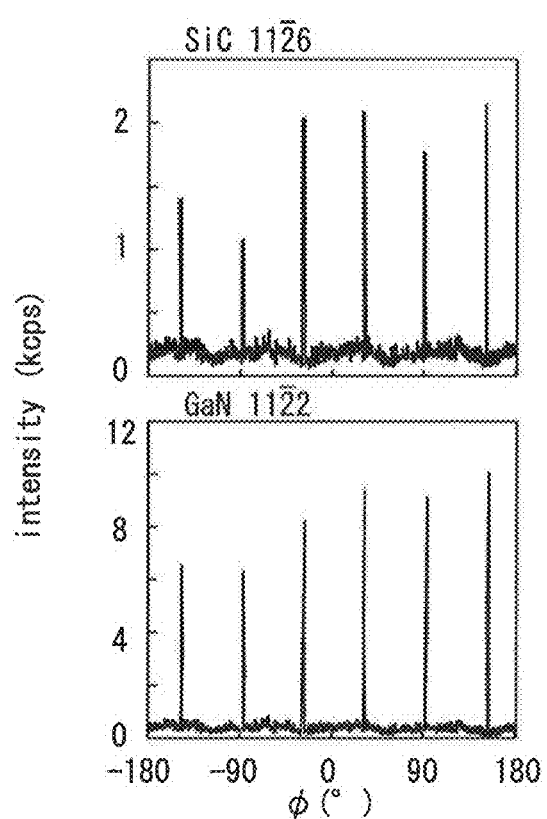
F I G. 8

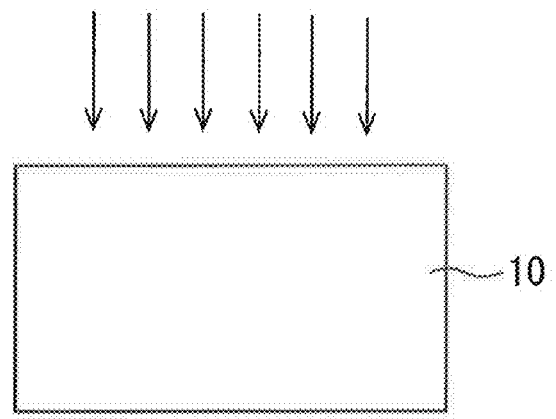
F I G. 1 4
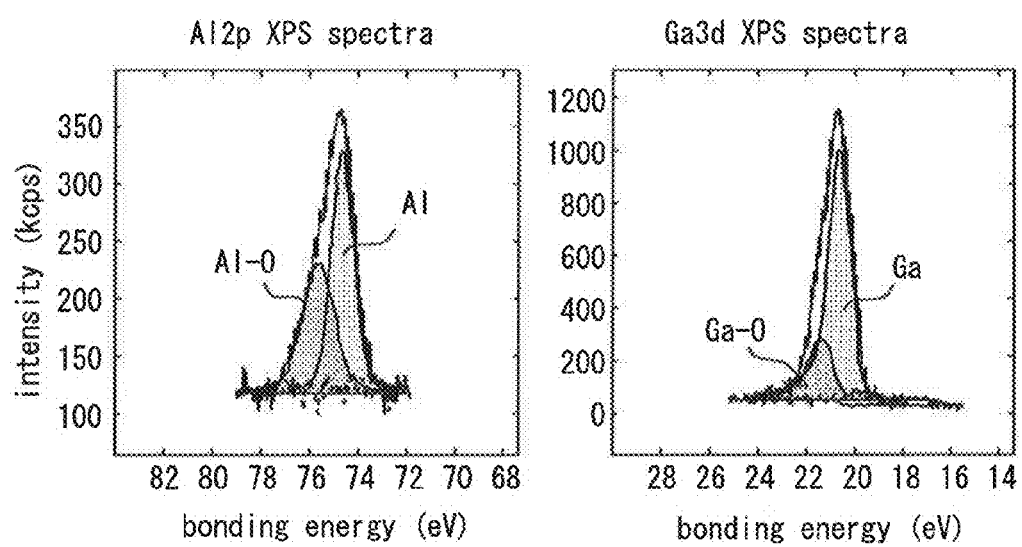
F I G. 1 5 A          F I G. 1 5 B

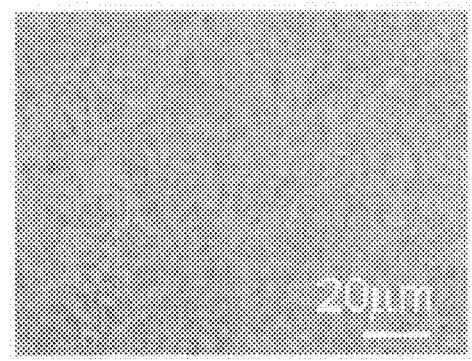
F I G. 1 6
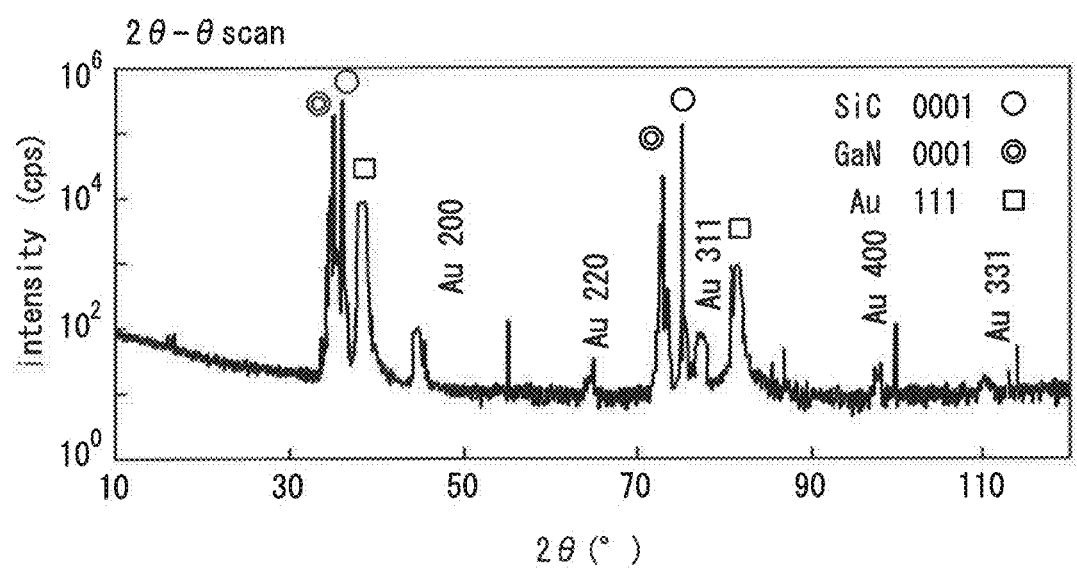
F I G. 1 7

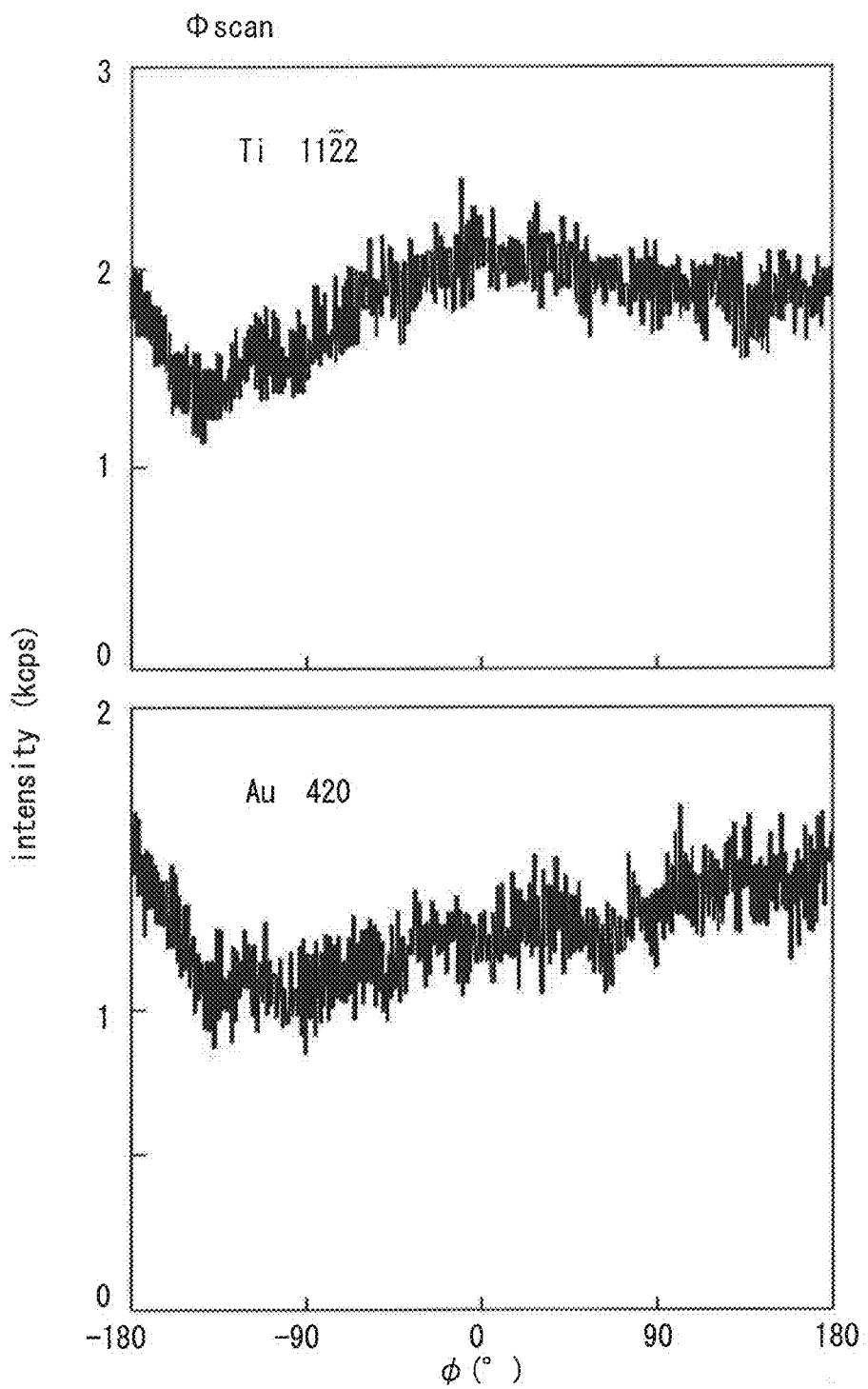
F I G. 1 8

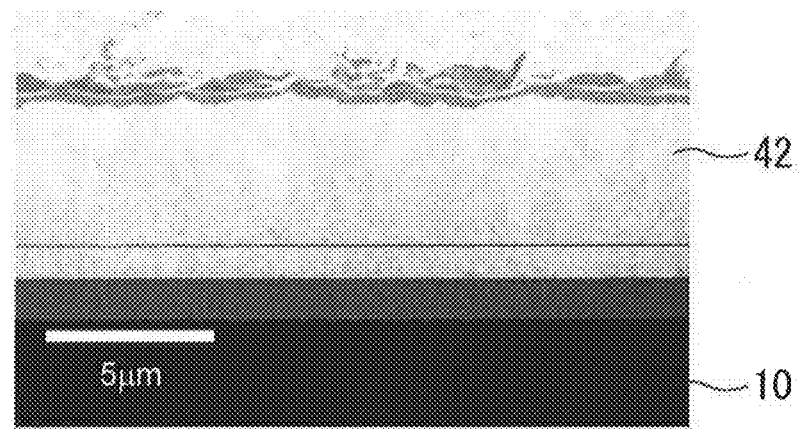
F I G. 1 9
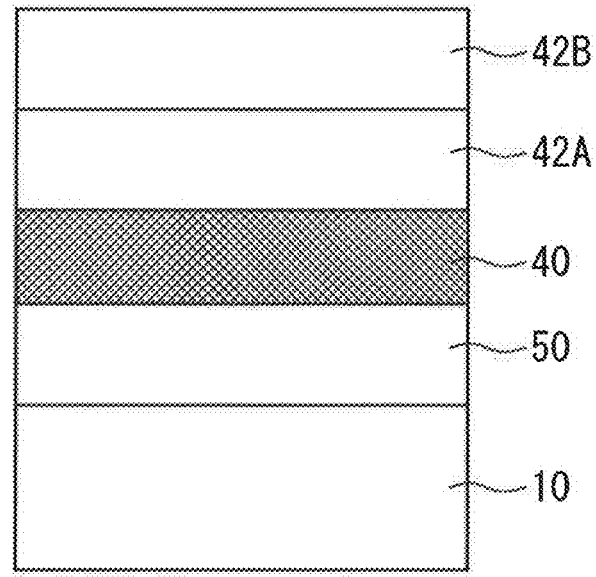
F I G. 2 0

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device having a conductive film used, e.g., as an electrode pad, and also relates to a method of manufacturing such a semiconductor device.

2. Background Art

Japanese Laid-Open Patent Publication No. 2005-191380 discloses a semiconductor device in which a plurality of conductive films are formed on a substrate. The substrate is a GaAs substrate, and the conductive films are formed of Mo and Au.

A conductive film on a substrate is preferably formed in such a manner that it has a flat surface and does not have a peculiar appearance. It has been found, however, that during the formation of a conductive film on a substrate, the conductive film epitaxially grows on the substrate and thereby forms large grains, creating a peculiar appearance.

SUMMARY OF THE INVENTION

The present invention has been made to solve this problem. It is, therefore, an object of the present invention to provide a semiconductor device in which the conductive film(s) formed on the substrate does not have a peculiar appearance. Another object of the invention is to provide a method of manufacturing such a semiconductor device.

The features and advantages of the present invention may be summarized as follows.

According to one aspect of the present invention, a semiconductor device includes a substrate having a hexagonal crystal structure and a (0001) surface, and a plurality of conductive films formed on the surface of the substrate. The plurality conductive films include a first conductive film and a second conductive film formed above the first conductive film, the first conductive film has a crystal structure which does not have a plane that has symmetry equivalent to symmetry of atomic arrangement in the surface of the substrate, the second conductive film has a crystal structure having at least one plane that has symmetry equivalent to symmetry of atomic arrangement in the surface of the substrate, and the second conductive film is polycrystalline and has a grain size of no more than 15 μm.

According to another aspect of the present invention, a method of manufacturing a semiconductor device includes the steps of applying plasma irradiation, ion milling, or dry etching to a (0001) surface of a substrate having a hexagonal crystal structure so as to form an amorphous layer on the substrate, and forming an over-the-amorphous conductive film above the amorphous layer. The over-the-amorphous conductive film is polycrystalline, has a grain size of no more than 15 μm, and has a crystal structure having at least one plane that has symmetry equivalent to symmetry of atomic arrangement in the surface of the substrate.

Other and further objects, features and advantages of the invention will appear more fully from the following description.

BRIEF DESCRIPTION OF THE DRAWINGS

FIG. 1 is a cross-sectional view of a semiconductor device in accordance with a first embodiment of the present invention;

FIG. 2 is a cross-sectional view of a comparative semiconductor device;

FIGS. 3A and 3B show optical micrographs of the surfaces of semiconductor device samples with and without the first conductive film;

FIG. 4 is a diagram showing a method of determining the orientation of crystal planes of a sample relative to the c-axis direction;

FIGS. 5A and 5B each shows a result of a 2θ-θ scan;

FIG. 8 shows detected SiC (11$\bar{2}$6) diffraction peaks and detected GaN (11$\bar{2}$2) diffraction peaks;

FIG. 14 is a diagram showing the way in which plasma irradiation, ion milling, or dry etching is applied to the surface of the substrate;

FIGS. 15A and 15B show X-ray photoelectron spectroscopy spectra;

FIG. 16 is an optical micrograph of the surface of the over-the-amorphous conductive film of the third embodiment;

FIG. 17 is a graph of results of a 2θ-θ scan on the surface of the semiconductor device of the third embodiment;

FIG. 18 is a graph of results of a Φ-scan on the semiconductor device of the third embodiment;

FIG. 19 is a photograph of a cross-section of the semiconductor device of the third embodiment; and FIG. 20 is a cross-sectional view of the semiconductor device of the fourth embodiment.

DETAILED DESCRIPTION OF THE PREFERRED EMBODIMENTS

Figure 6:
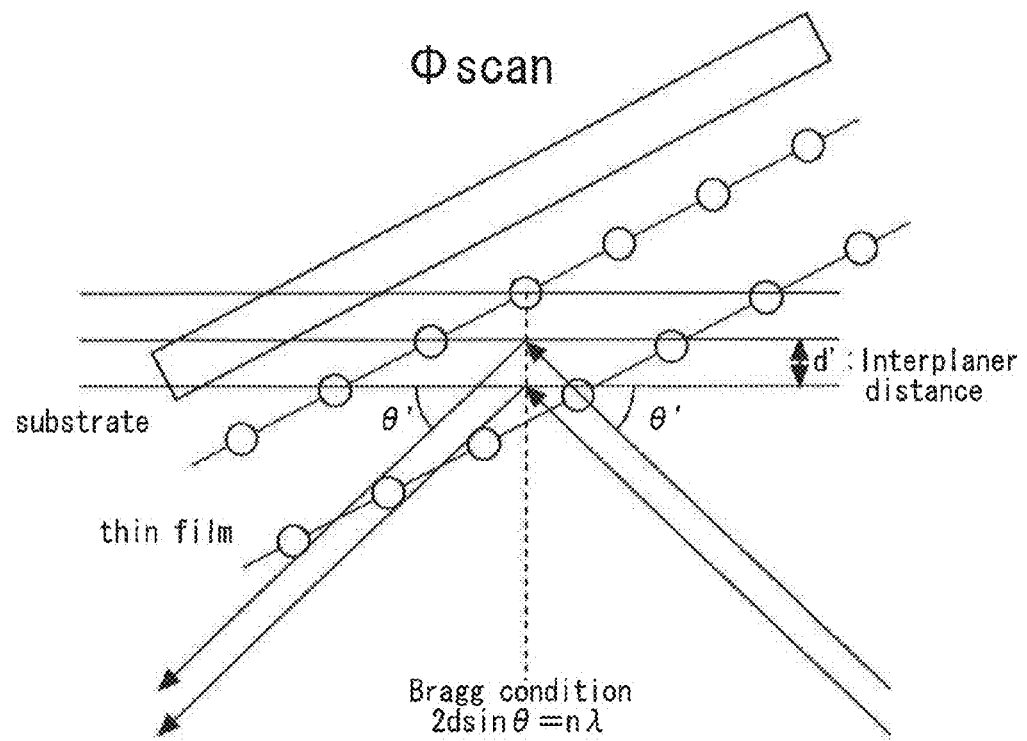
FIG. 6 is diagram showing a method of determining the orientation of crystal planes of a sample relative to the a-axis direction.

Semiconductor devices and methods of manufacturing a semiconductor device in accordance with embodiments of the present invention will be described with reference to the accompanying drawings. Throughout the specification the same or corresponding components are designated by the same reference symbols and may be described only once.

First Embodiment

FIG. 1 is a cross-sectional view of a semiconductor device in accordance with a first embodiment of the present invention. This semiconductor device has a substrate 10 with a hexagonal crystal structure having a (0001) surface. The substrate 10 is, e.g., an Al$_2$O$_3$ single crystal substrate. A conductive film structure 12 is formed on the surface of the substrate 10. The conductive film structure 12 includes a first conductive film 14 and a second conductive film 16 formed above the first conductive film 14.

The first conductive film 14 has a crystal structure which does not have a plane that has symmetry equivalent to the symmetry of the atomic arrangement in the surface of the substrate 10. The first conductive film 14 is formed of, e.g., Nb. The crystal structure of the second conductive film 16 has at least one plane that has symmetry equivalent to the symmetry of the atomic arrangement in the surface of the substrate 10. The second conductive film 16 is formed of, e.g., Au. The second conductive film 16 is polycrystalline and has a grain size of no more than 15 μm.

FIG. 2 is a cross-sectional view of a comparative semiconductor device. This semiconductor device has the substrate 10 described in connection with the semiconductor device of the present embodiment and has an Au film 20 formed on the surface of the substrate 10. That is, the comparative semiconductor device differs from the semiconductor device of the present embodiment in that it includes the Au film 20 instead of the second conductive film 16 of Au and does not include the first conductive film 14 of Nb.

FIG. 3 includes FIGS. 3A and 3B showing optical micrographs of the surfaces of semiconductor device samples with and without the first conductive film. Specifically, FIG. 3A is an optical micrograph of the surface of a sample of a conventional semiconductor device having a substrate formed of SiC (0001)/AlN (0001)/GaN (0001)/AlGaN (0001) films or layers, where the film or films on the right side of each symbol "/" overlie the film or films on the left side of the symbol. This sample is produced by forming a layer of Ti on the top surface (i.e., the AlGaN (0001) surface) of the substrate and then forming a layer of Au and a layer of Pt on the Ti layer. It should be noted that AlGaN has a hexagonal wurtzite structure, Ti has a hexagonal close-packed structure, and Au and Pt have a face-centered cubic structure.

The micrograph of FIG. 3A shows small streaks, which present a peculiar appearance. The presence of these streaks was due to the fact that the Ti, Au, and Pt layers had grown on the substrate in an epitaxial manner and thereby formed large grains.

FIG. 3B is an optical micrograph of the surface of a sample of the first embodiment. That is, this sample differs from the above conventional semiconductor device sample in that an Nb layer having a face-centered cubic structure is interposed between the substrate and the Ti layer. As can be seen from FIG. 3B, the surface of this sample is flat. The reason for this is that the Nb layer prevented epitaxial growth of the Ti, Au, and Pt layers.

It should be noted that epitaxial growth refers to the growth of a crystalline layer on a crystalline substrate in such a manner that the crystalline layer has the same crystal orientation as that of the substrate. The c- and a-axes of the epitaxially grown crystalline layer align with those of the substrate.

FIG. 4 is a diagram showing a method of determining the orientation of crystal planes of a sample relative to the c-axis direction by means of X-ray diffraction. Specifically in this method, a 2θ-θ scan is performed to determine the orientation of crystal planes of the sample relative to the c-axis direction, as shown in FIG. 4. The 2θ-θ scan technique allows one to determine the orientation of crystal planes of, e.g., a conductive film of Au on a substrate relative to the surface of the substrate. FIG. 5 includes FIGS. 5A and 5B each showing results of a 2θ-θ scan. Specifically, FIG. 5A is a graph of results of a 2θ-θ scan on the conventional semiconductor device sample described above. As shown in FIG. 5A, all of the observed Au diffraction peaks are associated with the (111) plane, indicating that the conductive film of Au of the conventional semiconductor device sample was a single crystal.

FIG. 5B is a graph of results of a 2θ-θ scan on the sample of the present embodiment. As shown in FIG. 5B, the observed Au diffraction peaks are associated with a plurality of different crystal planes in addition to the (111) plane, indicating that the conductive film of Au of the sample of the present embodiment was polycrystalline. It should be noted that, in the graphs of FIGS. 5A and 5B, the Au (111) peaks are greater than other Au diffraction peaks, meaning that the Au films of both the conventional semiconductor device sample and the sample of the present embodiment were preferentially oriented along the (111) plane.

Figure 7:
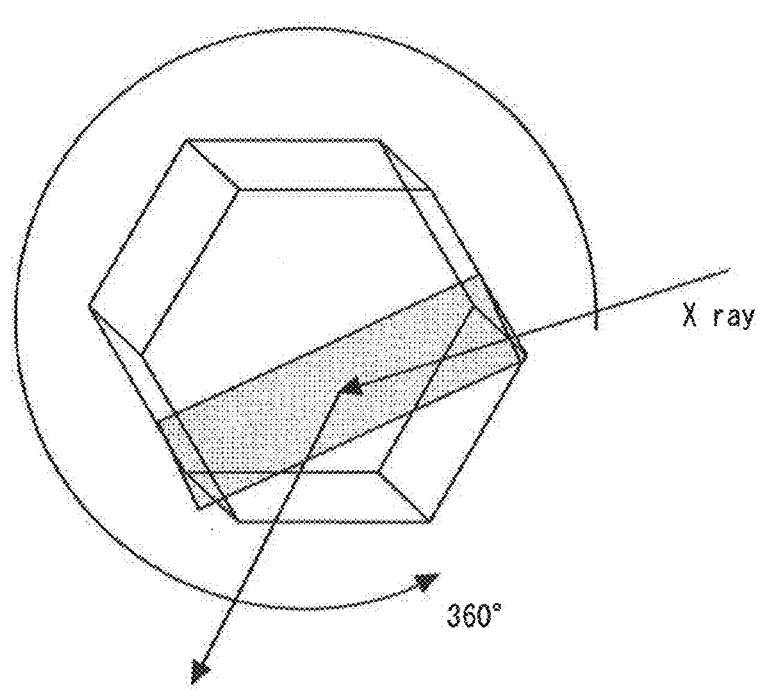
FIG. 7 shows a Φ-scan technique in which the direction of incidence of the X-ray is fixed and the substrate is rotated 360°.

FIG. 6 is a diagram showing a method of determining the orientation of crystal planes of a sample relative to the a-axis direction by means of X-ray diffraction. Specifically in this method, a Φ-scan is performed to determine the orientation of planes of the sample relative to the a-axis direction, as shown in FIG. 6. The Φ-scan technique allows one to determine the crystal orientations in, e.g., a conductive film and thereby determine the symmetry and orientation of the conductive film. It should be noted that FIG. 7 shows a Φ-scan technique in which the direction of incidence of the X-ray is fixed and the substrate is rotated 360°.

Before performing a Φ-scan on the conventional semiconductor device sample and the sample of the present embodiment, SiC and GaN samples were examined for SiC (11$\bar{2}$6) and GaN (11$\bar{2}$2) diffraction peaks, for reference purposes. (It should be noted that the substrates of the conventional semiconductor device sample and the sample of the present embodiment are formed of material containing SiC and GaN.) FIG. 8 includes two graphs, one showing the detected SiC (11$\bar{2}$6) diffraction peaks and the other showing the detected GaN (11$\bar{2}$2) diffraction peaks. Specifically, as shown in FIG. 8, the SiC (11$\bar{2}$6) diffraction peaks were six in number and were spaced from each other by an angle of 60°, and likewise the GaN (11$\bar{2}$2) diffraction peaks were also six in number and were spaced from each other by an angle of 60°, indicating that SiC and GaN are hexagonal crystals.

Figures 9A, 9B:
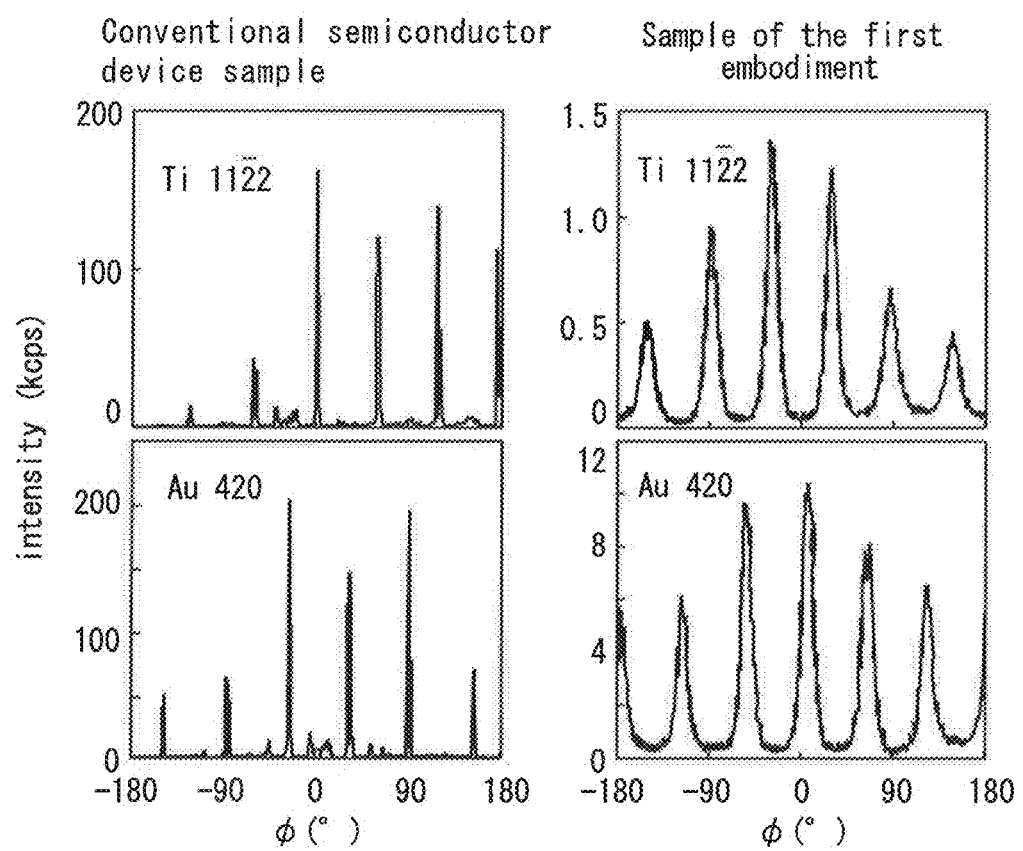
FIGS. 9A and 9B show results of the Φ-scan on the conventional semiconductor device sample and the sample of the present embodiment.

FIG. 9 includes FIGS. 9A and 9B showing results of the Φ-scan on the conventional semiconductor device sample and the sample of the present embodiment. Specifically, FIG. 9A is a graph of results of the Φ-scan on the conventional semiconductor device sample. As shown, the detected Ti (11$\bar{2}$2) diffraction peaks and Au (420) diffraction peaks had a half-width substantially equal to that of the SiC (11$\bar{2}$6) and GaN (11$\bar{2}$2) diffraction peaks of the previously tested SiC and GaN samples (see FIG. 8), meaning that the Ti and Au layers were grown on the GaN of the substrate in an epitaxial manner.

FIG. 9B is a graph of results of the Φ-scan on the sample of the present embodiment. A total of six Ti (11$\bar{2}$2) diffraction peaks and six Au (420) diffraction peaks were observed. However, these diffraction peaks were displaced from the Ti (11$\bar{2}$2) diffraction peaks and Au (420) diffraction peaks observed in the Φ-scan on the conventional semiconductor device sample by a rotation angle of 30° and had a wider half-width. This means that the Ti and Au conductive films of the sample of the present embodiment were not fully crystallized.

It follows from the above results that, when forming a conductive film on a substrate, epitaxial growth of the conductive film can be prevented by first forming an Nb layer on the substrate and then forming the conductive film on the Nb layer. In the case of the sample of the present embodiment, the above X-ray diffraction results show that the conductive films of Au, Ti, etc. of the sample were prevented from growing in an epitaxial manner.

Figure 10:
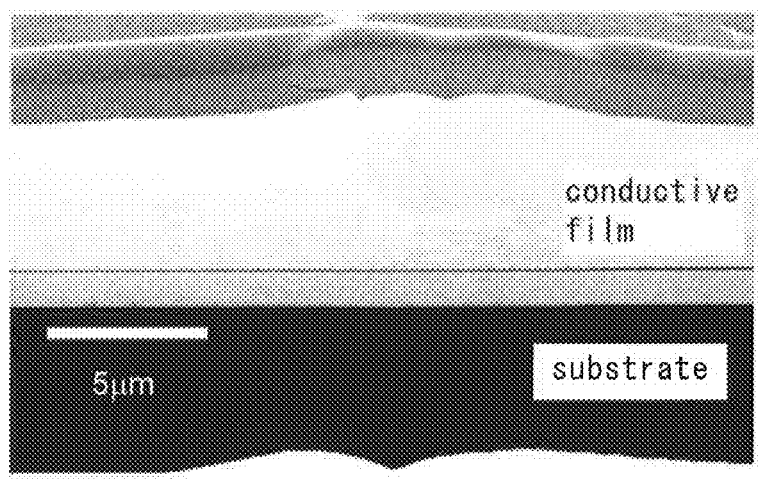
FIG. 10 is a photograph of a cross-section of the conventional semiconductor device sample.
Figure 11:
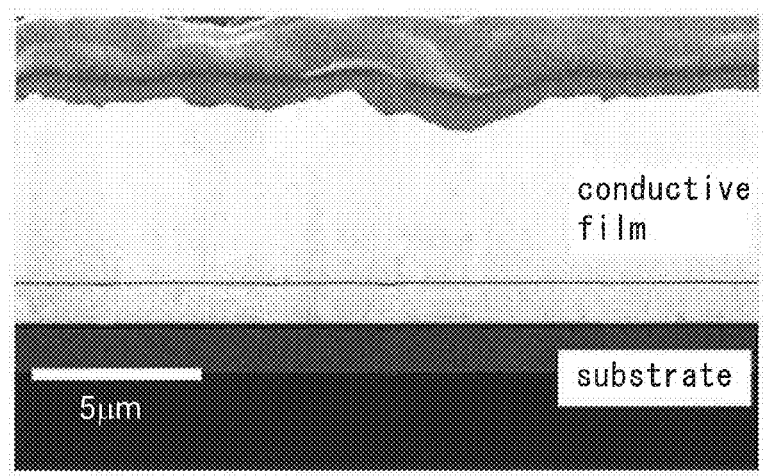
FIG. 11 is a photograph of a cross-section of the sample of the present embodiment.

Cross-sections of the samples were observed as described below. FIG. 10 is a photograph of a cross-section of the conventional semiconductor device sample. As shown, the conductive films of the sample had substantially no observed grain boundaries. Further, the conductive films had a grain size of greater than 15 µm. FIG. 11 is a photograph of a cross-section of the sample of the present embodiment. As shown, the conductive films of the sample of the present embodiment had many grain boundaries, and the sizes of the grains were 1.3-2.0 µm. The presence of these gains (of relatively small size) was considered to have affected the surface roughness of the conductive films.

It follows from the above that, when forming a conductive film on a substrate, if the conductive film has a plane having symmetry equivalent to that of the atomic arrangement in the surface of the substrate, then the conductive film epitaxially grows on the substrate and its gains increase in size. This results in formation of large grains, creating a peculiar appearance. For example, forming an Au layer on a (0001) surface of a hexagonal substrate, as in the comparative semiconductor device, results in epitaxial growth of the Au layer, which causes a peculiar appearance.

In the semiconductor device of the first embodiment, on the other hand, the crystal structure of the first conductive film 14 does not have a plane that has symmetry equivalent to the symmetry of the atomic arrangement in the surface of the substrate 10. As a result, the first conductive film 14 does not epitaxially grow, but instead grows to a polycrystalline form having a grain size of no more than 15 µm. The second conductive film 16 is also polycrystalline since it is formed on the polycrystalline first conductive film 14, thus minimizing the possibility that the semiconductor device has a peculiar appearance.

The conductive film structure 12 may include a conductive film or films in addition to the first conductive film 14 and the second conductive film 16. The semiconductor device of the first embodiment is characterized in that the crystal structure of the material (Nb) of the first conductive film 14 is such that the first conductive film 14 does not epitaxially grow on the substrate 10 but grows to a polycrystalline form. As a result, the conductive film (16) formed on the first conductive film 14 also grows to a polycrystalline form. Various alterations may be made to the semiconductor device of the first embodiment while retaining this feature.

Although the substrate 10 has been described as a single crystal substrate, it is to be understood that the substrate 10 may be a single crystal substrate with one or a plurality of epitaxial films formed thereon. Specifically, for example, the substrate 10 may be a single crystal substrate having one or a plurality of semiconductor epitaxial films of Group III nitride compound semiconductor formed thereon. It should be noted that the misorientation angle of the substrate surface is preferably within ±5° (inclusive).

The substrate 10 may be formed of material including, but not limited to, materials having a corundum structure and those having a wurtzite structure. Although the surface of the substrate 10 has been described as an $Al_2O_3$ (0001) surface, it is to be understood that it may be a GaN (0001) surface, a ZnO (0001) surface, or an SiC (0001) surface.

The first conductive film 14 may be formed of a material selected from the group consisting of, e.g., Mo, Nb, W, Ta, V, Cr, and Fe. The second conductive film 16 may be formed of a material selected from the group consisting of, e.g., Au, Pt, Cu, Ti, Co, Sr, Y, Zr, Ru, Pd, Ag, Ir, WN, WC, TaN, WSi, and ZnO. In the conductive film structure 12, at least one conductive film may be formed above the first conductive film 14 by plating. It should be noted that the above alterations to the semiconductor device and the semiconductor device manufacturing method of the first embodiment may also be made to the semiconductor devices and the semiconductor device manufacturing methods of the subsequently described embodiments.

Second Embodiment

Figure 12:
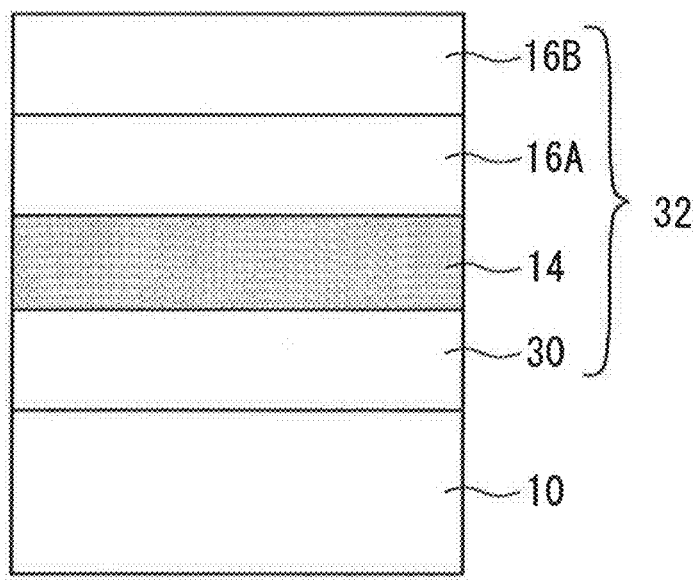
FIG. 12 is a cross-sectional view of the semiconductor device of the second embodiment.

A second embodiment of the present invention provides a semiconductor device which has many features common to the semiconductor device of the first embodiment. Therefore, the following description of the second embodiment will be primarily limited to the differences from the first embodiment. FIG. 12 is a cross-sectional view of the semiconductor device of the second embodiment. In this semiconductor device, an intermediate conductive film 30 is formed on the substrate 10. The crystal structure of the intermediate conductive film 30 has at least one plane that has symmetry equivalent to the symmetry of the atomic arrangement in the surface of the substrate 10. The intermediate conductive film 30 is formed of, e.g., Au. A first conductive film 14 is formed on the intermediate conductive film 30, and a second conductive film 16A is formed on the first conductive film 14. A second conductive film 16B is formed on the second conductive film 16A. The intermediate conductive film 30, the first conductive film 14, and the second conductive films 16A and 16B together form a conductive film structure 32.

In the semiconductor device of the second embodiment, the first conductive film 14 is polycrystalline and, as a result, the second conductive films 16A and 16B formed on the first conductive film 14 are also polycrystalline, thus minimizing the possibility that the semiconductor device has a peculiar appearance. In order to prevent the conductive film structure 32 from having a peculiar appearance, the conductive film structure 32 must include at least one first conductive film (such as the first conductive film 14) and at least one second conductive film (such as the second conductive films 16A and 16B). However, the conductive film structure 32 may include a plurality of first conductive films instead of one, and/or a plurality of second conductive films instead of one. Further, the intermediate conductive film 30 may or may not be formed between the first conductive film 14 and the substrate 10.

Third Embodiment

Figure 13:
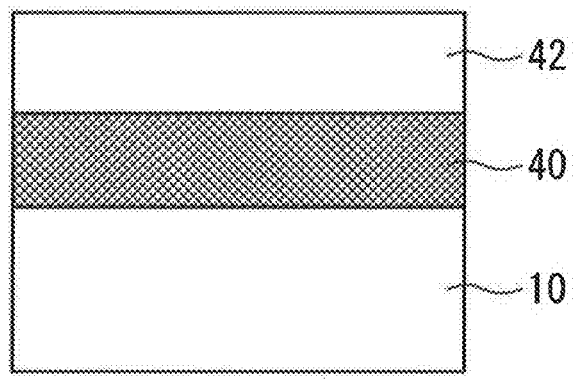
FIG. 13 is a cross-sectional view of a semiconductor device in accordance with a third embodiment of the present invention.

FIG. 13 is a cross-sectional view of a semiconductor device in accordance with a third embodiment of the present invention. This semiconductor device includes an amorphous layer 40 formed on the substrate 10. An over-the-amorphous conductive film 42 is formed on the amorphous layer 40. The over-the-amorphous conductive film 42 is, e.g., Au or Ti/Au. The over-the-amorphous conductive film 42 is a polycrystalline film having a grain size of no more than 15 µm. Further, the crystal structure of the over-the-amorphous conductive film 42 has at least one plane that has symmetry equivalent to the symmetry of the atomic arrangement in the surface of the substrate 10.

A method of manufacturing a semiconductor device in accordance with the third embodiment will be described. This method begins by applying plasma irradiation, ion milling, or dry etching to a (0001) surface of a hexagonal substrate 10. FIG. 14 is a diagram showing the way in which plasma irradiation, ion milling, or dry etching is applied to the surface of the substrate. As a result of this step, an amorphous layer 40 is formed on the substrate 10. An over-the-amorphous conductive film 42 is then formed on the amorphous layer 40. This completes the manufacture of the semiconductor device shown in FIG. 13.

FIG. 15 includes FIGS. 15A and 15B showing X-ray photoelectron spectroscopy (XPS) spectra obtained from the surface of a substrate sample of the present embodiment. Specifically, the surface of a substrate sample of SiC (0001)/AlN (0001)/GaN (0001)/AlGaN (0001) was irradiated with oxygen plasma and then the bonding state of the atoms in the surface was determined by XPS. FIG. 15A shows the detected Al2p spectrum. FIG. 15B shows the detected Ga3d spectrum. Peak separation analysis on the spectra has revealed that Al—O and Ga—O bonds were formed in the surface of the substrate, that is, an AlGaN oxide layer was formed in the surface. In this way, an amorphous AlGaN oxide layer can be formed in the surface of the substrate by irradiating the surface with oxygen plasma.

FIG. 16 is an optical micrograph of the surface of the over-the-amorphous conductive film 42 of the third embodiment. As shown, the surface of the over-the-amorphous conductive film 42 was flat, and there were no streaks in the surface which would create a peculiar appearance. This indicates that the over-the-amorphous conductive film 42 was prevented from growing in an epitaxial manner. It should be noted that the over-the-amorphous conductive film 42 shown in FIG. 16 was formed of Ti/Au.

FIG. 17 is a graph of results of a 2θ-θ scan on the surface of the semiconductor device of the third embodiment. As shown, the Au (111) peaks were large, meaning that the over-the-amorphous conductive film 42 was preferentially oriented along the (111) plane. However, the presence of Au diffraction peaks associated with a plurality of other plane orientations indicates that the over-the-amorphous conductive film 42 was crystallized to a polycrystalline form.

FIG. 18 is a graph of results of a Φ-scan on the semiconductor device of the third embodiment. In this Φ-scan no diffraction peaks were observed and the background intensity was greater than that in the above described Φ-scan on the conventional semiconductor device sample and the sample of the first embodiment. This indicates that the over-the-amorphous conductive film 42 was polycrystalline.

FIG. 19 is a photograph of a cross-section of the semiconductor device of the third embodiment. The over-the-amorphous conductive film 42 had many grain boundaries. The over-the-amorphous conductive film 42 was polycrystalline, and the sizes of the grains were approximately 0.16-0.3 μm.

It follows from the above that the over-the-amorphous conductive film 42 does not epitaxially grow on the amorphous layer 40, but grows to a polycrystalline form having a grain size of no more than 15 μm. Thus, the over-the-amorphous conductive film 42 is prevented from having a peculiar appearance.

The over-the-amorphous conductive film 42 is not limited to Au or Ti/Au, but may be formed of a material selected from the group consisting of, e.g., Pt, Cu, Ti, Co, Sr, Y, Zr, Ru, Pd, Ag, Ir, WN, WC, TaN, WSi, and ZnO. Further, the over-the-amorphous conductive film 42 may be formed, e.g., by plating.

Fourth Embodiment

A fourth embodiment of the present invention provides a semiconductor device and a method of manufacturing a semiconductor device which have many features common to the semiconductor device and the method of manufacturing a semiconductor device in accordance with the third embodiment. Therefore, the following description of the fourth embodiment will be primarily limited to the differences from the third embodiment. FIG. 20 is a cross-sectional view of the semiconductor device of the fourth embodiment. In this semiconductor device, an intermediate conductive film 50 is formed between the substrate 10 and the amorphous layer 40. The crystal structure of the intermediate conductive film 50 has at least one plane that has symmetry equivalent to the symmetry of the atomic arrangement in the surface of the substrate 10. The intermediate conductive film 50 is formed of, e.g., Au. An over-the-amorphous conductive film 42A is formed on the amorphous layer 40. An over-the-amorphous conductive film 42B is formed on the over-the-amorphous conductive film 42A.

Since the semiconductor device of the fourth embodiment is configured in such a manner that the over-the-amorphous conductive films 42A and 42B are disposed on the amorphous layer 40, in the manufacture of the semiconductor device these films do not epitaxially grow, but grows to a polycrystalline form, thus minimizing the possibility that the semiconductor device has a peculiar appearance. In order to prevent the conductive film structure from having a peculiar appearance, the conductive film structure must include at least one amorphous layer (such as the amorphous layer 40) and at least one over-the-amorphous conductive film (such as the over-the-amorphous conductive films 42A and 42B) formed on the at least one amorphous layer. However, the conductive film structure may include a plurality of amorphous layers instead of one, and/or a plurality of over-the-amorphous conductive films instead of one. Further, the intermediate conductive film 50 may or may not be formed between the amorphous layer 40 and the substrate 10.

The present invention enables a conductive film to be formed on the surface of a substrate in such a manner that the conductive film does not epitaxially grow and hence does not have a peculiar appearance.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-091548, filed on Apr. 24, 2013 including specification, claims, drawings and summary, on which the Convention priority of the present application is based, is incorporated herein by reference in its entirety.

What is claimed is:

1. A semiconductor device comprising:
a substrate having a hexagonal crystalline structure and a (0001) surface; and
a plurality of conductive films on said surface of said substrate, wherein
said plurality conductive films includes a first conductive film and a second conductive film located above said first conductive film relative to said surface,
said first conductive film has a crystalline structure which does not have a plane that has a symmetry equivalent to a symmetry of atomic arrangement in said surface of said substrate,
said second conductive film has a crystalline structure having at least one plane that has a symmetry equivalent to the symmetry of atomic arrangement in said surface of said substrate, and
said second conductive film is polycrystalline and has a grain size no larger than 15 μm.

2. The semiconductor device according to claim 1, wherein said substrate includes a single crystal substrate and a semiconductor epitaxial film of a Group III nitride compound semiconductors on said single crystal substrate.

3. The semiconductor device according to claim 1, wherein at least one of said plurality of conductive films is a plated film located above said first conductive film relative to said surface is a plated film.

4. The semiconductor device according to claim 1, wherein said substrate has the corundum structure or the wurtzite structure.

5. The semiconductor device according to claim 1, wherein said surface of said substrate is selected from the group consisting of an $Al_2O_3$ (0001) surface, a GaN (0001) surface, a ZnO (0001) surface, and an SiC (0001) surface.

6. The semiconductor device according to claim 1, wherein said second conductive film is a material selected from the group consisting of Au, Pt, Cu, Ti, Co, Sr, Y, Zr, Ru, Pd, Ag, Ir, WN, WC, TaN, WSi, and ZnO.

7. The semiconductor device according to claim 1, wherein said first conductive film is a material selected from the group consisting of Mo, Nb, W, Ta, V, Cr, and Fe.

8. A method of manufacturing a semiconductor device, comprising:
   applying plasma irradiation, ion milling, or dry etching to a (0001) surface of a substrate having a hexagonal crystalline structure and forming an amorphous layer on said substrate; and
   forming an over-the-amorphous-layer conductive film above said amorphous layer relative to said surface, wherein said over-the-amorphous-layer conductive film is polycrystalline, has a grain size no larger than 15 µm, and has a crystalline structure having at least one plane that has a symmetry equivalent to symmetry of atomic arrangement in said surface of said substrate.

9. The method according to claim 8, including forming said over-the-amorphous-layer conductive film by plating.

\* \* \* \* \*